(12) United States Patent
Kim

(10) Patent No.: US 12,292,481 B2
(45) Date of Patent: May 6, 2025

(54) BOOSTER KIT FOR BATTERY REUSE

(71) Applicant: LG CHEM, LTD., Seoul (KR)

(72) Inventor: Doyul Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 1227 days.

(21) Appl. No.: 17/051,076

(22) PCT Filed: Sep. 17, 2019

(86) PCT No.: PCT/KR2019/011972
§ 371 (c)(1),
(2) Date: Oct. 27, 2020

(87) PCT Pub. No.: WO2020/085648
PCT Pub. Date: Apr. 30, 2020

(65) Prior Publication Data
US 2021/0231741 A1   Jul. 29, 2021

(30) Foreign Application Priority Data
Oct. 23, 2018   (KR) .................. 10-2018-0126688

(51) Int. Cl.
*G01R 31/385* (2019.01)
*G01R 31/3835* (2019.01)
*H01M 10/42* (2006.01)
*H01M 50/543* (2021.01)

(52) U.S. Cl.
CPC ....... *G01R 31/385* (2019.01); *G01R 31/3835* (2019.01); *H01M 10/425* (2013.01); *H01M 50/543* (2021.01); *H01M 2010/4271* (2013.01)

(58) Field of Classification Search
CPC ............. G01R 31/385; G01R 31/3835; H01M 50/543; H01M 10/425; H01M 2010/4271
See application file for complete search history.

(56) References Cited

U.S. PATENT DOCUMENTS

| 10,003,106 B2 | 6/2018 | Jeon et al. |
| 2009/0067202 A1 | 3/2009 | Ichikawa et al. |
| 2011/0175575 A1 | 7/2011 | Wu et al. |
| 2012/0181873 A1 | 7/2012 | Butzmann et al. |
| 2014/0125284 A1 | 5/2014 | Qahouq |
| 2015/0207347 A1 | 7/2015 | Hori et al. |
| 2017/0346334 A1 | 11/2017 | Mergener et al. |

FOREIGN PATENT DOCUMENTS

| CN | 103548234 A | 1/2014 |
| JP | 2002-320339 A | 10/2002 |
| JP | 2010-148242 A | 7/2010 |
| JP | 2012-533979 A | 12/2012 |

(Continued)

OTHER PUBLICATIONS

International Search Report (PCT/ISA/210) issued in PCT/KR2019/011972, dated Dec. 23, 2019.

*Primary Examiner* — Christopher E Mahoney
(74) *Attorney, Agent, or Firm* — Birch, Stewart, Kolasch & Birch, LLP

(57) ABSTRACT

The present invention relates to a booster kit for reusing a battery to create an environment enabling the supply of power and managing a voltage to each battery cell or battery module of the battery cells having usable voltages.

6 Claims, 2 Drawing Sheets

(56) References Cited

FOREIGN PATENT DOCUMENTS

| | | |
|---|---|---|
| JP | 2013-192388 A | 9/2013 |
| JP | 2015-139310 A | 7/2015 |
| JP | 2016-119788 A | 6/2016 |
| JP | 6114321 B2 | 4/2017 |
| KR | 10-1165593 B1 | 7/2012 |
| KR | 10-2013-0040346 A | 4/2013 |
| KR | 10-2014-0028350 A | 3/2014 |
| KR | 10-2016-0043838 A1 | 4/2016 |
| KR | 10-2018-0013576 A | 2/2018 |
| KR | 10-1840608 B1 | 3/2018 |
| KR | 10-2018-0087791 A | 8/2018 |
| WO | WO 2013/076565 A1 | 5/2013 |
| WO | WO 2017/139284 A2 | 8/2017 |
| WO | WO-2019207852 A1 * 10/2019 ............. G06F 1/263 |

\* cited by examiner

[Figure 1]
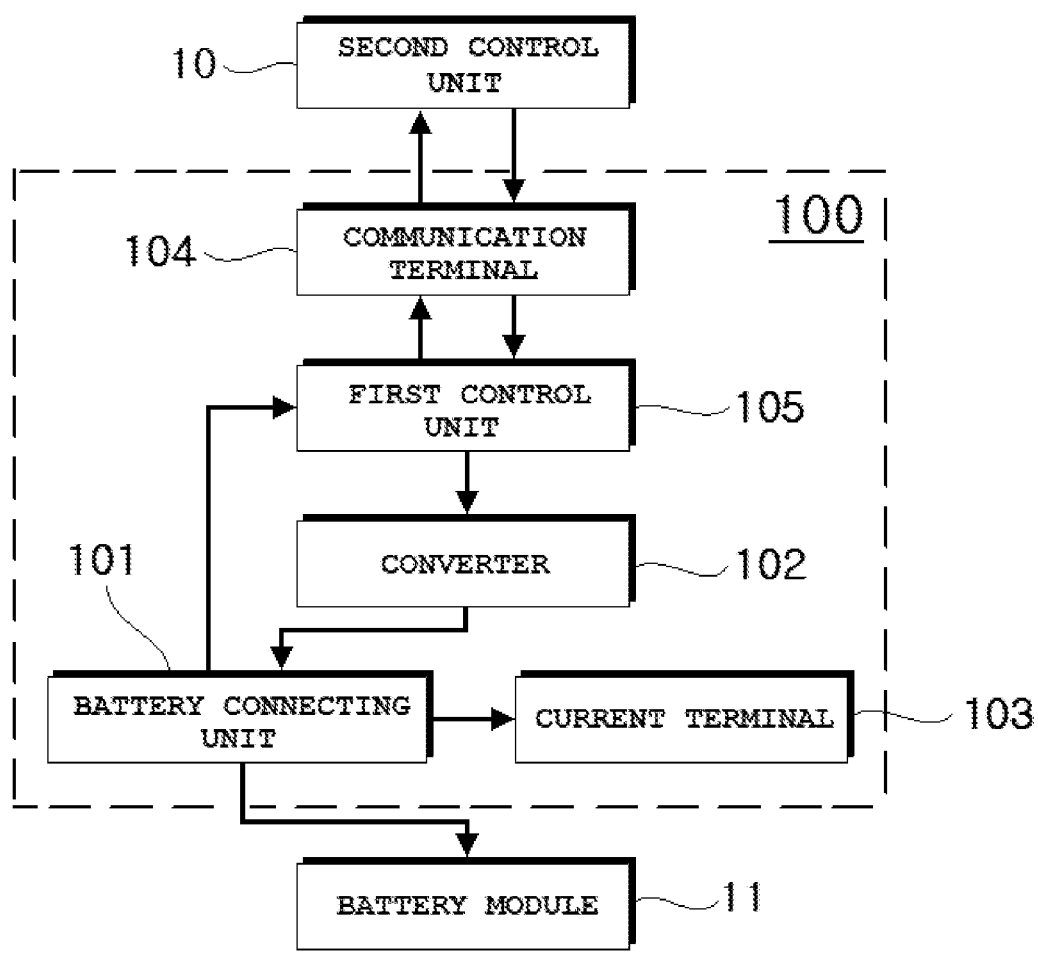

[Figure 2]
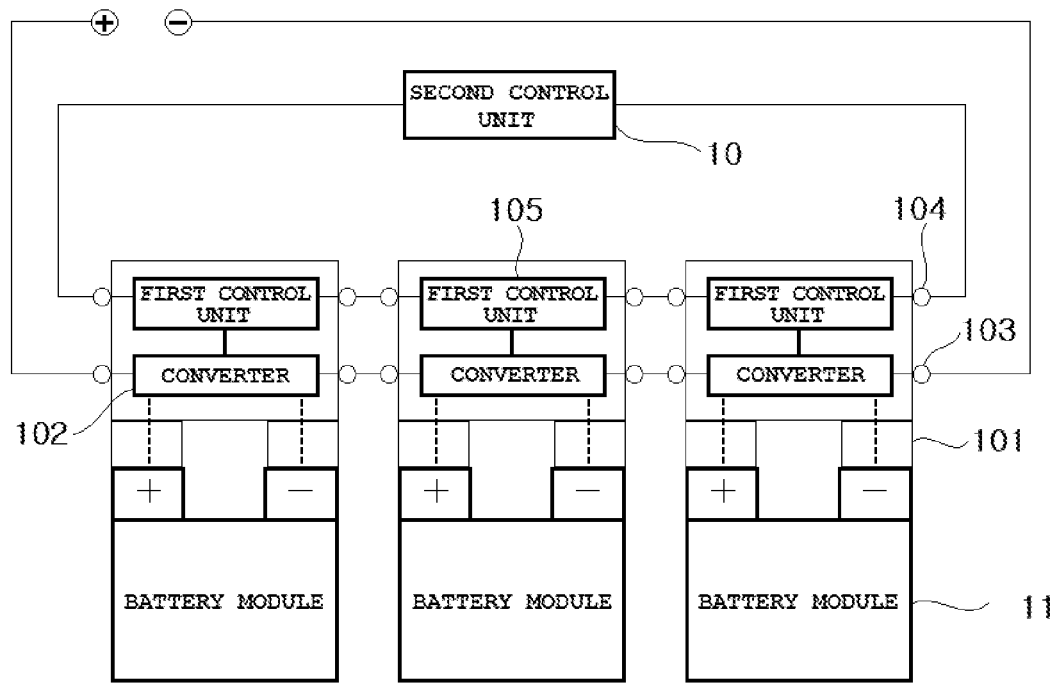
[Figure 3]
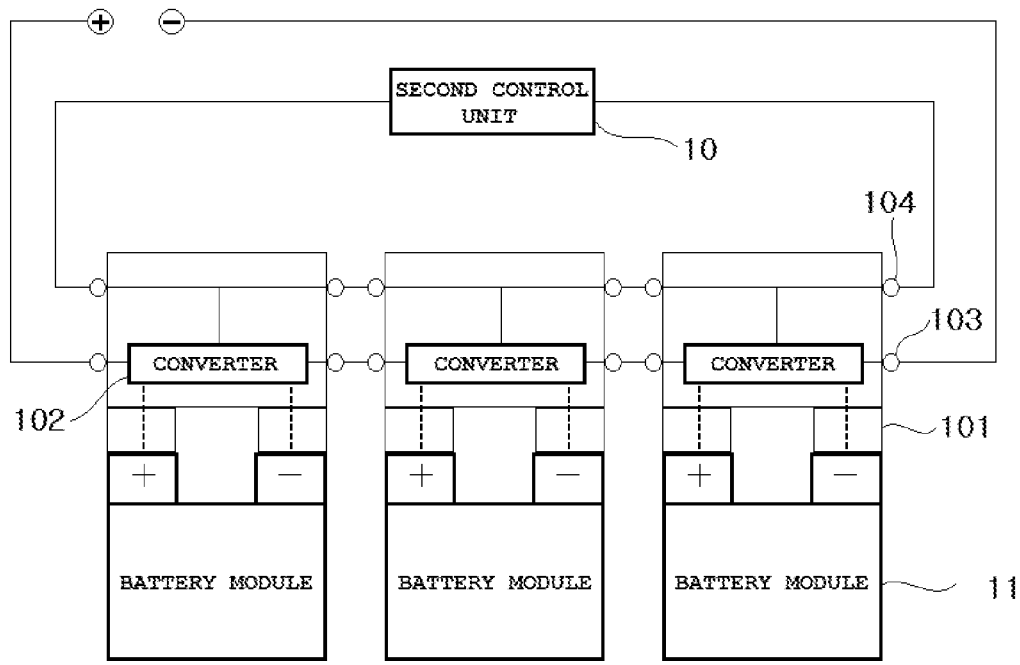

BOOSTER KIT FOR BATTERY REUSE

TECHNICAL FIELD

This application claims priority to and the benefit of Korean Patent Application No. 10-2018-0126688 filed in the Korean Intellectual Property Office on Oct. 23, 2018, the entire contents of which are incorporated herein by reference.

The present invention relates to a booster kit for reusing a battery, and particularly, to a booster kit for reusing a battery which can create an environment enabling the supply of power, by attaching a kit, capable of managing a voltage, to each battery cell or battery module of the battery cells or battery modules having still usable voltages, and connecting kits to each other.

BACKGROUND ART

A rechargeable battery, which has a high applicability to a product group and an electrical property such as a high energy density, is widely applied to not only a portable device, but also an electric vehicle (EV) or a hybrid electric vehicle (HEV) which is driven by an electrical driving source. The rechargeable battery has attracted attention as a new energy source for improving an environment-friendly property and energy efficiency in that it is possible to innovatively decrease the use of fossil energy, which is the primary advantage, and a by-product according to the use of energy is not generated at all.

However, at the stage of using the rechargeable battery, it is considered for its environment-friendly aspect, but as usage of a system that employs a large-capacity rechargeable battery such as a car and an energy storage system (ESS) increases, there may occur problems at the disposal stage of used rechargeable batteries. The rechargeable battery is a collection of various chemicals and has problems in that the rechargeable battery may cause a harmful effect on the environment at the disposal stage and the disposal thereof is costly.

Therefore, it may be necessary to create a reuse environment for rechargeable batteries in the related art that have been used in a system requiring a high voltage, such as using the rechargeable batteries as long as possible by applying the rechargeable batteries to a system requiring a relatively low voltage, instead of immediately disposing of the rechargeable batteries due to reduction in voltage.

DETAILED DESCRIPTION OF THE INVENTION

Technical Problem

The present invention is conceived to solve the problems, and an object of the present invention is to introduce a booster kit for reusing a battery which, when kits including boosters are attached and connected to each other in order to reuse rechargeable batteries in a system that is driven with a voltage that is relatively lower than in the environment in which the rechargeable batteries are used in the related art, can maintain a voltage required to drive the system and use all the energy of the rechargeable batteries to be reused by a method of allocating a target voltage to each of the rechargeable batteries and changing a voltage by using the booster according to a voltage state of the rechargeable battery connected to each of the kits.

Technical Solution

An exemplary embodiment of the present invention provides a booster kit for reusing a battery, including: a battery connecting unit connected to a positive (+) electrode and a negative (−) electrode of a battery module of the battery; a converter configured to change a voltage of the battery module: a current terminal configured to supply current of the battery module to outside of the battery; and a communication terminal configured to receive a control signal and to transmit the control signal to the converter, in which the converter changes the voltage of the battery module based on the control signal.

In the exemplary embodiment, the booster kit may further include a first control unit configured to measure a voltage value of the battery module, transmit the measured voltage value to a second control unit separate from the booster kit, receive the control signal generated in the second control unit, and control an operation of the converter based on the control signal.

In the exemplary embodiment, the battery connecting unit, the converter, the current terminal, the communication terminal, and the first control unit may constitute one modularized kit.

In the exemplary embodiment, the booster kit is configured to be connected to multiple battery modules that are connected together, and when the booster kit is connected to the multiple battery modules, the current terminal may connect to the multiple battery modules and supply current of the multiple battery modules to the outside.

In the exemplary embodiment, the first control unit may maintain a voltage value allocated to the entirety of the multiple battery modules.

In the exemplary embodiment, in order to maintain the voltage value allocated to the entirety of the multiple battery modules connected to each other, when there is a first battery module among the multiple battery modules having a voltage value equal to or less than an average value among the multiple battery modules connected to each other, the first control unit may boost voltages of the battery modules except for the first battery module.

In the exemplary embodiment, in order to maintain the voltage value allocated to the entirety of the multiple battery modules connected to each other, when there is a first battery module among the multiple battery modules having a voltage value equal to or less than a predetermined value among the multiple battery modules connected to each other, the first control unit may block the connection to the corresponding battery module and boost voltages of the battery modules except for the first battery module.

Another exemplary embodiment of the present invention provides a battery management system including a booster kit for reusing a battery, the battery management system including: a battery connecting unit connected to a positive (+) electrode and a negative (−) electrode of each of one or more battery modules; a converter configured to change a voltage of each of the one or more battery modules; a current terminal configured to supply current of each of the one or more battery modules to outside of the battery; a second control unit configured to generate a control signal for controlling the converter; and a communication terminal configured to receive the control signal, in which the converter changes the voltage of each of the battery modules based on the control signal.

In the exemplary embodiment, the battery management system may further include a first control unit configured to control an operation of the converter by measuring a voltage value for each of the one or more battery modules, transmitting the measured voltage value to the second control unit, and receiving the control signal from the second control unit.

In the exemplary embodiment, the battery connecting unit, the converter, the current terminal, the communication terminal, and the first control unit may constitute one modularized kit.

Advantageous Effects

The booster kit for reusing a battery according to the exemplary embodiment of the present invention has advantages in that when kits including boosters are attached and connected to each other in order to reuse rechargeable batteries in a system that is driven with a voltage that is relatively lower than in the environment in which the rechargeable batteries are used in the related art, it is possible to maintain a voltage required to drive the system and use all the energy of the rechargeable batteries to be reused by a method of allocating a target voltage to each of the rechargeable batteries and changing a voltage by using the booster according to a voltage state of the rechargeable battery connected to each of the kits.

BRIEF DESCRIPTION OF DRAWINGS

FIG. 1 is a diagram illustrating a configuration of a booster kit 100 for reusing a battery according to an exemplary embodiment of the present invention.

FIG. 2 is a diagram illustrating an example of the booster kit 100 for reusing a battery according to an exemplary embodiment of the present invention.

FIG. 3 is a diagram illustrating another example of the booster kit 100 for reusing a battery according to an exemplary embodiment of the present invention.

MODE FOR CARRYING OUT THE INVENTION

The present invention will be described below in detail with reference to the accompanying drawings. Herein, a repeated description and a detailed description of the publicly-known functions and configurations, which may unnecessarily obscure the gist of the present invention, will be omitted. Exemplary embodiments of the present invention are provided for more completely explaining the present invention to a person with ordinary skill in the art. Thus, the shape, size and the like of elements in the drawings may be exaggerated for clear explanation.

Throughout the specification, when a part "includes or comprises" a constituent element, it indicates the further inclusion of any other constituent elements, not the exclusion of any other elements, unless explicitly described to the contrary.

In addition, the terms " . . . unit" or " . . . part", or the like described in the specification mean units for processing at least one function and operation and can be implemented by hardware or software and combinations thereof.

FIG. 1 is a diagram illustrating a configuration of a booster kit 100 for reusing a battery according to an exemplary embodiment of the present invention, and FIG. 2 is a diagram illustrating an example of the booster kit 100 for reusing a battery according to an exemplary embodiment of the present invention.

Referring to FIGS. 1 and 2, the booster kit 100 for reusing a battery according to an exemplary embodiment of the present invention may include a battery connecting unit 101, a converter 102, a current terminal 103, and a communication terminal 104. Further, in an additional exemplary embodiment, the booster kit 100 may further include a first control unit 105.

The battery management system 100 illustrated in FIGS. 1 and 2 is the exemplary embodiment, but the constituent elements thereof are not limited to the exemplary embodiment illustrated in FIGS. 1 and 2, and some constituent elements may be added, changed, or deleted as necessary.

First, the battery connecting unit 101, the converter 102, the current terminal 103, the communication terminal 104, and the first control unit 105 to be described below may constitute one modularized kit.

The battery connecting unit 101 may be connected to a positive (+) electrode and a negative (−) electrode of a battery module 11.

Herein, this may mean that the battery connecting unit 101 is attached to the positive electrode and the negative electrode of the battery module 11, and a point where the battery connecting unit 101 is attached may be made of a material having conductivity such as copper and iron.

Further, the battery connecting unit 101 enables the positive electrode and the negative electrode of the battery module 11 to be connected up to the converter 102 to be described below.

Next, the converter 102 may change a voltage of the battery module 11.

Herein, the converter 102 may change the voltage of the battery module 11 based on a control signal to be described below.

Next, the current terminal 103 may supply current of the battery module to the outside.

Further, when there are multiple battery modules 11 attached with the kits, the current terminal 103 may connect the multiple battery modules 11 attached with the kits to each other and supply current of the multiple battery modules 11 connected to each other to the outside.

Herein, the outside may refer to a device which is electrically connected to an end of the current terminal 103 of a system, configured as the booster kit 100 for reusing a battery according to an exemplary embodiment, and receives the current from the multiple battery modules 11 connected to each other.

Next, the communication terminal 104 may receive a control signal for the converter 103.

Herein, the communication terminal 104 may receive a control signal generated in a second control unit 10 and transmit the control signal to the first control unit 105 or the converter 102.

The case where the communication terminal 104 directly transmits the control signal generated in the second control unit 10 to the converter 102 will be described with reference to an example according to an exemplary embodiment of FIG. 3.

FIG. 3 is a diagram illustrating another example of the booster kit 100 for reusing a battery according to an exemplary embodiment of the present invention.

Referring to FIG. 3, the second control unit 10 may send a control signal to each of the converters 102 capable of changing voltages of the multiple battery modules 11 connected to each other by kits. In the example of FIG. 3, the second control unit 10 may directly measure a voltage value for a battery module 11 without using the first control unit 105 to be described below, and control the converter 102 which changes the voltage of each of the multiple battery modules 11 connected to each other based on the measured voltage value.

A method of directly controlling the converter 102 by the control signal generated in the second control unit 10 may be the same as a method used in a process in which the communication terminal 104 receives a control signal generated in the second control unit 10 and transmits the control signal to the first control unit 105, and the first control unit 105 controls the converter 102 based on the control signal, which will be described below.

Additionally, the first control unit 105 may measure a voltage value for the battery module 11 and transmit the measured voltage value to the separate second control unit 10, and then receive a control signal generated in the second control unit 10 and control an operation of the converter 102 based on the control signal.

Further, the first control units 105 may maintain a voltage value allocated to the entirety of the multiple battery modules 11 connected to each other.

Herein, the allocated voltage value may mean a voltage value for driving the aforementioned external device which is connected to the system configured as the booster kit 100 for reusing a battery and receives current as illustrated in FIG. 2.

Further, in order to maintain the voltage value allocated to the entirety of the multiple battery modules 11 connected to each other, when there is a battery module 11 having a voltage value equal to or less than an average value among the multiple battery modules 11 connected to each other, the first control unit 105 may boost voltages of the battery modules 11 except for the corresponding battery module 11.

Here, when it is determined that a difference between the voltage value of the battery module 11 having the voltage value equal to or less than the average value and the average value of the voltages of the multiple battery modules 11 connected to each other is relatively large, the battery module 11 having the voltage value equal to or less than the average value may be excluded from targets whose voltages are to be boosted, and in order to meet a driving voltage of the system configured as the kit, the voltages of the battery modules 11 having the voltage value equal to or more than the average value or close to the average value may be boosted.

Further, in order to maintain the voltage value allocated to the entirety of the multiple battery modules 11 connected to each other, when there is a battery module 11 having a voltage value equal to or less than a predetermined value among the multiple battery modules 11 connected to each other, the first control unit 105 may block a connection to the corresponding battery module 11 and boost voltages of the battery modules 11 except for the corresponding battery module 11.

Here, the voltage value equal to or less than the predetermined value may mean a voltage value of a battery module 11 completely discharged or in a state close to a completely discharged state or a battery module 11, failing to properly perform a function as a power source due to the occurrence of an abnormality, among the multiple battery modules 11 connected to each other in the system configured as the kit.

In the forgoing, the present invention has been described with reference to the exemplary embodiments of the present invention, but those skilled in the art may appreciate that the present invention may be variously corrected and changed without departing from the spirit and the scope of the present invention described in the appending claims.

The invention claimed is:

1. A booster kit for reusing a battery, the booster kit comprising:

a battery connecting unit connected to a positive (+) electrode and a negative (−) electrode of a plurality of battery modules of the battery;

a plurality of converters, each converter being configured to convert a voltage of a respective battery module of the plurality of battery modules;

a current terminal configured to supply current of the plurality of battery modules to outside of the battery; and a communication terminal configured to receive a control signal from a second control unit and transmit the control signal to a plurality of first control units, wherein the plurality of first control units are configured to:

measure a voltage value of each battery module of the plurality of battery modules, transmit the measured voltage value of each battery module of the plurality of battery modules to the second control unit separate from the booster kit, receive the control signal generated in the second control unit, and control an operation of the plurality of converters based on the control signal, wherein the plurality of converters are configured to convert the voltage of the plurality of battery modules based on the control signal, wherein the control signal generated by the second control unit includes a total voltage value for the plurality of battery modules, and wherein each of the plurality of first control units is configured to control an operation of a respective converter, independently of the control signal, to convert a voltage of a respective battery module to output a voltage value so that the plurality of battery modules can output the total voltage value included in the control signal.

2. The booster kit of claim 1, further comprising a modularized kit comprising the battery connecting unit, the plurality of converters, the current terminal, the communication terminal, and the plurality of first control units.

3. The booster kit of claim 2, wherein the booster kit is configured to be connected to the plurality of battery modules that are connected together, and wherein when the booster kit is connected to the plurality of battery modules, the current terminal connects to the plurality of battery modules and supplies current of the plurality of battery modules to the outside.

4. The booster kit of claim 3, wherein the plurality of first control units maintain the total voltage value allocated to the entirety of the plurality of battery modules.

5. The booster kit of claim 4, wherein in order to maintain the total voltage value for the plurality of battery modules connected to each other, when there is a first battery module among the plurality of battery modules having a voltage value equal to or less than an average value among the plurality of battery modules connected to each other, the plurality of first control units adjust an output of the plurality of converters such that voltages of the plurality of battery modules are boosted except for the voltage of the first battery module.

6. The booster kit of claim 4, wherein in order to maintain the total voltage value for the plurality of battery modules connected to each other, when there is a first battery module among the plurality of battery modules having a voltage value equal to or less than a predetermined value among the plurality of battery modules connected to each other, the plurality of first control units block a connection to the corresponding battery module and adjust an output of the plurality of converters such that voltages of the battery modules are boosted except for the voltage of the first battery module.

* * * * *